(12) United States Patent
Du et al.

(10) Patent No.: US 10,173,400 B2
(45) Date of Patent: Jan. 8, 2019

(54) TRANSPARENT CONDUCTIVE FILM

(71) Applicants: NANCHANG O-FILM DISPLAY TECHNOLOGY CO., LTD., Nanchang (CN); SHENZHEN O-FILM TECH. CO., LTD., Shenzhen (CN)

(72) Inventors: Shuang Du, Nanchang (CN); Peihong Wang, Nanchang (CN); Xiaowei Hou, Nanchang (CN)

(73) Assignees: NANCHANG O-FILM DISPLAY TECHNOLOGY CO., LTD., Nanchang (CN); SHENZHEN O-FILM TECH. CO., LTD., Shenzhen (CN)

( * ) Notice: Subject to any disclaimer, the term of this patent is extended or adjusted under 35 U.S.C. 154(b) by 0 days.

(21) Appl. No.: 15/637,324

(22) Filed: Jun. 29, 2017

(65) Prior Publication Data

US 2018/0170016 A1   Jun. 21, 2018

(30) Foreign Application Priority Data

Dec. 19, 2016   (CN) .................... 2016 2 1393127 U

(51) Int. Cl.
*G02B 5/02* (2006.01)
*H01B 1/22* (2006.01)
(Continued)

(52) U.S. Cl.
CPC ........ *B32B 27/08* (2013.01); *B32B 17/10009* (2013.01); *B32B 27/281* (2013.01);
(Continued)

(58) Field of Classification Search
CPC ...... G06F 3/041; G06F 3/0414; G06F 3/0416; G06F 3/042; G06F 3/044; G06F 3/045;
(Continued)

(56) References Cited

U.S. PATENT DOCUMENTS 8,313,201 B2 * 11/2012 Wakizaka ............... G02B 1/111
   359/599
2013/0133933 A1 * 5/2013 Tsuno .................. H05K 1/0313
   174/255

FOREIGN PATENT DOCUMENTS

JP   2006206831 A   8/2006
JP   2009029108 A   2/2009
(Continued)

OTHER PUBLICATIONS

JPO office action dated Sep. 11, 2018 in connection with the corresponding Japanese patent application.

*Primary Examiner* — Fernando L Toledo
*Assistant Examiner* — Aaron J Gray
(74) *Attorney, Agent, or Firm* — Platinum Intellectual Property LLP

(57) ABSTRACT

A transparent conductive film includes a substrate having opposed first and second surfaces; a first hard coating layer formed on the first surface; a first optical adjustment layer formed on the first hard coating layer, the first optical adjustment layer comprising a second binder resin and a plurality of second particles distributed in the second binder resin; a first transparent conductor layer formed on the first optical adjustment layer, the first transparent conductor layer having a plurality of protrusions on a surface thereof corresponding to the plurality of second particles; a second hard coating layer formed on the second surface; a second optical adjustment layer formed on the second hard coating layer; and a second transparent conductor layer formed on the second optical adjustment layer.

19 Claims, 8 Drawing Sheets

(51) Int. Cl.
    *B32B 17/10*     (2006.01)
    *B32B 27/08*     (2006.01)
    *B32B 27/28*     (2006.01)
    *B32B 27/32*     (2006.01)
    *B32B 27/36*     (2006.01)
    *B32B 27/40*     (2006.01)
    *C03C 17/42*     (2006.01)
    *C23C 14/00*     (2006.01)
    *C23C 14/02*     (2006.01)
    *C23C 14/08*     (2006.01)
    *G06F 3/041*     (2006.01)
    *G06F 3/044*     (2006.01)
    *H01J 37/32*     (2006.01)
    *H01L 51/52*     (2006.01)

(52) U.S. Cl.
    CPC .......... *B32B 27/325* (2013.01); *B32B 27/365* (2013.01); *B32B 27/40* (2013.01); *C03C 17/42* (2013.01); *C23C 14/0042* (2013.01); *C23C 14/024* (2013.01); *C23C 14/086* (2013.01); *G02B 5/0242* (2013.01); *G06F 3/041* (2013.01); *G06F 3/044* (2013.01); *G06F 3/0412* (2013.01); *G06F 3/0414* (2013.01); *H01B 1/22* (2013.01); *H01J 37/32431* (2013.01); *H01L 51/5268* (2013.01); *B32B 2264/025* (2013.01); *B32B 2264/0221* (2013.01); *B32B 2264/0235* (2013.01); *B32B 2264/102* (2013.01)

(58) Field of Classification Search
    CPC .... G06F 3/046; G06F 3/047; G06F 2203/041; G06F 2203/04102; G06F 2203/04103; G06F 2203/04107; G06F 3/0412; H01L 51/5268; H01L 51/5275; G02B 5/0242; B32B 27/08
    USPC ............. 257/415, 98; 438/50; 359/601, 599; 345/173, 174; 977/834
    See application file for complete search history.

(56)     References Cited

FOREIGN PATENT DOCUMENTS

| | | |
|---|---|---|
| JP | 2013107214 A | 6/2013 |
| JP | 2015005272 A | 1/2015 |
| JP | 2016081733 A | 5/2016 |
| JP | 2016189102 A | 11/2016 |
| WO | 2016163323 A1 | 10/2016 |

* cited by examiner

TRANSPARENT CONDUCTIVE FILM

CROSS REFERENCE TO RELATED APPLICATION

This application claims priority under 35 U.S.C. § 119 to Chinese Patent Application No. 201621393127.5, filed on Dec. 19, 2016, the entire content of which is incorporated herein in its entirety.

FIELD OF THE INVENTION

The present disclosure relates to conductive films, and more particularly relates to a transparent conductive film used in a capacitance-type touch panel.

BACKGROUND OF THE INVENTION

A conventional transparent conductive film comprises a substrate, hard coating layers and transparent conductor layers formed on both surfaces of the substrate. The conventional hard coating layer includes a binder resin and a plurality of particles. However, since the large diameter particles are directly added to the hard coating layer, there is a problem that the transmittance of the transparent conductive film is decreased, the haze and the surface roughness is increased, thereby affecting the surface appearance of the product and user experience.

SUMMARY

Therefore, it is necessary to provide a transparent conductive film which can improve the transmittance, reduce the haze and the roughness.

A transparent conductive film includes a substrate having opposed first and second surfaces; a first hard coating layer formed on the first surface, the first hard coating layer comprising a first binder resin and a plurality of first particles distributed in the first binder resin; a first optical adjustment layer formed on the first hard coating layer, the first optical adjustment layer comprising a second binder resin and a plurality of second particles distributed in the second binder resin; a first transparent conductor layer formed on the first optical adjustment layer, the first transparent conductor layer having a plurality of protrusions on a surface thereof corresponding to the plurality of second particles; a second hard coating layer formed on the second surface; a second optical adjustment layer formed on the second hard coating layer; and a second transparent conductor layer formed on the second optical adjustment layer.

A transparent conductive film includes a substrate having opposed first and second surfaces; a first hard coating layer formed on the first surface; a first optical adjustment layer formed on the first hard coating layer, the first optical adjustment layer comprising a binder resin and a plurality of particles distributed in the binder resin; a first transparent conductor layer formed on the first optical adjustment layer, the first transparent conductor layer having a plurality of protrusions on a surface thereof corresponding to the plurality of particles; a first metal layer formed on the first transparent conductor layer; a second hard coating layer formed on the second surface; a second optical adjustment layer formed on the second hard coating layer, the second optical adjustment layer comprising the binder resin and the plurality of particles distributed in the binder resin; a second transparent conductor layer formed on the second optical adjustment layer, the second transparent conductor layer having a plurality of protrusions on a surface thereof corresponding to the plurality of particles; and a second metal layer formed on the second transparent conductor layer.

A capacitance-type touch panel includes a transparent conductive film, wherein the transparent conductive film includes a substrate having opposed first and second surfaces; a first hard coating layer formed on the first surface, the first hard coating layer comprising a first binder resin and a plurality of first particles distributed in the first binder resin; a first optical adjustment layer formed on the first hard coating layer, the first optical adjustment layer comprising a second binder resin and a plurality of second particles distributed in the second binder resin; a first transparent conductor layer formed on the first optical adjustment layer, the first transparent conductor layer having a plurality of protrusions on a surface thereof corresponding to the plurality of second particles; a second hard coating layer formed on the second surface; a second optical adjustment layer formed on the second hard coating layer; and a second transparent conductor layer formed on the second optical adjustment layer.

The above and other features of the invention including various novel details of construction and combinations of parts, and other advantages, will now be more particularly described with reference to the accompanying drawings and pointed out in the claims.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE EMBODIMENTS

Embodiments of the invention are described more fully hereinafter with reference to the accompanying drawings, in which preferred embodiments of the invention are shown. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
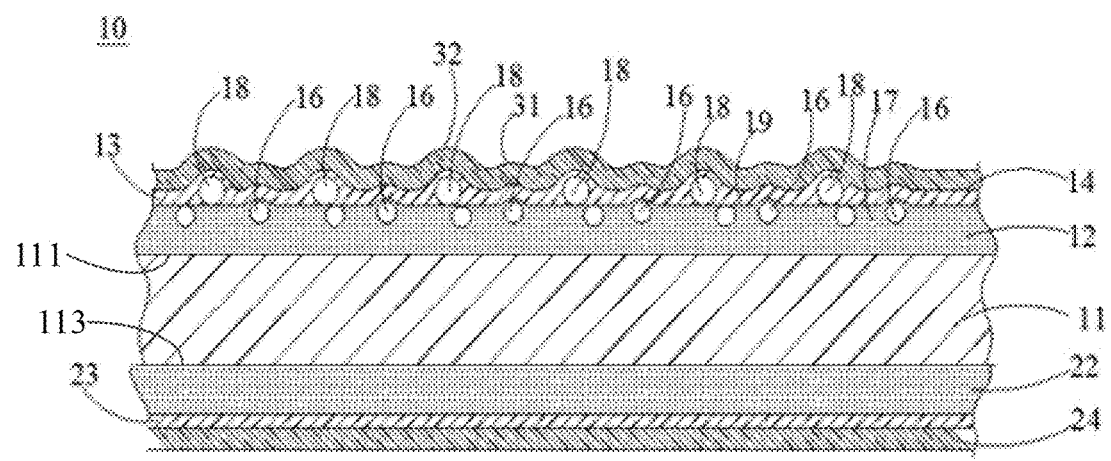
FIG. 1 is a cross-sectional view of a transparent conductive film according to a first embodiment.

Referring to FIG. 1, a transparent conductive film 10 according to a first embodiment can be applied to display terminals such as mobile phones, tablets or the like where a capacitance-type touch panel is required. The transparent conductive film 10 includes a substrate 11 having opposed first surface 111 and second surface 113. The transparent conductive film 10 further includes a first hard coating layer 12, a first optical adjustment layer 13, and a first transparent conductor layer 14, which are sequentially laminated on the first surface 111. The transparent conductive film 10 further includes a second hard coating layer 22, a second optical adjustment layer 23, and a second transparent conductor layer 24, which are sequentially laminated on the second surface 113.

The substrate 11 may be formed by a crystalline polymer film or a non-crystalline polymer film. Since the non-crystalline polymer film has a less birefringence than that of the crystalline polymer film and is more uniform, color irregularity in the transparent conductive film 10 can be eliminated. The non-crystalline polymer film used in the embodiment has an in-plane birefringence of about 0 to about 0.001. In one embodiment, the in-plane birefringence can range from about 0 to about 0.0005. The non-crystalline polymer film used in the embodiment has an in-plane birefringence irregularity of about 0.0005 or lower. In some embodiments, the in-plane birefringence irregularity is about 0.0003 or lower. The aforementioned birefringence and birefringence irregularity can be achieved by selecting a suitable type of non-crystalline polymer film.

A material of the non-crystalline polymer film can be polycarbonate, polycycloolefin or polyimide. The substrate 11 formed by the non-crystalline polymer film typically has a thickness of about 20 μm to about 200 μm. The non-crystalline polymer film may typically have a thin easily adhering layer (not shown) made of poly urethane on a surface thereof.

The first hard coating layer 12 is formed on the first surface 111 and the second hard coating layers 22 is formed on the second surface 113. The first hard coating layer 12 includes a first binder resin 17 and a plurality of first particles 16 distributed in the first binder resin 17. The first optical adjustment layer 13 includes a second binder resin 19 and a plurality of second particles 18 distributed in the second binder resin 19. The plurality of first particles 16 and the plurality of second particles 18 may be randomly distributed in the first binder resin 17 near a surface thereof and the second binder resin 19, respectively. It should be understood that, in alternative embodiments, the plurality of first particles 16 and the plurality of second particles 18 may also be evenly distributed in the first binder resin 17 near a surface thereof and the second binder resin 19, respectively.

In the illustrated embodiments, the first particles 16 and the second particles 18 are substantially sphere-shaped, such that the processing difficulty can be reduced and the transparent conductive film 10 is suitable for mass production. Furthermore, the sphere-shaped particles can reduce the occurrence of puncturing the transparent conductive film 10 due to the sharp contour of the amorphous particles when the transparent conductive film 10 is rolled up to a roll, thereby improving the production yield and reducing the cost.

The plurality of first particles 16 are typically made of acrylic polymer, silicone polymer, styrene polymer or inorganic silica. In the case where the plurality of first particles 16 are sphere-shaped, it has a diameter about 5% to about 25% of a thickness of the first hard coating layer 12. In the case where the plurality of first particles 16 are not sphere-shaped (for example, in an amorphous form), each of first particles 16 has a height (along a direction perpendicular to the surface of the substrate 11) of about 5% to about 25% of a thickness of the first hard coating layer 12.

Physical properties and materials for the plurality of second particles 18 are similar to those of first particles 16, except that a particle size of the second particle 18 is greater than that of the first particle 16. In some embodiments, the second particle 18 has a diameter of about 0.1 μm to about 2 μm. If the diameter of the second particle 18 is less than 0.1 μm, the performance of the anti-blocking is not enough. Otherwise, if the diameter of the second particle 18 is greater than 2 μm, transmittance of the film decreases, and the roughness of the film increases.

The first binder resin 17 and the second binder resin 19 typically include a UV curable resin composition or electron beams curable resin composition. In one embodiment, the curable resin composition contains a polymer obtained by subjecting glycidyl acrylate-based polymer to an addition reaction with acrylic acid. Alternatively, the curable resin composition contains multifunctional acrylate polymer (e.g. pentaerythritol or dipentaerythritol or the like). The curable resin composition further includes a polymer initiator.

In the illustrated embodiments, the first hard coating layer 12 and the second hard coating layer 22 have a thickness of about 1 μm to about 3 μm, which is convenient to reduce the overall thickness of the conductive film while ensuring that the damage resistance of the transparent conductive film 10 is not reduced, and to provide conditions for subsequent provision of ultra-thin electronic products or mobile terminals. In alternative embodiments, the second particle 18 has a diameter greater than a thickness of the second binder resin 19, thus the surface of the transparent conductive film 10 forms a plurality of protrusions to improve the pressure bonding resistance.

The surface of the first hard coating layer 12 has an arithmetic mean roughness Ra of about 0.005 μm to about 0.05 μm and has a maximum height Rz of about 0.5 μm to about 2.5 μm. This is similar to the arithmetic mean roughness Ra and the maximum height Rz of the surface of the second hard coating layer 22.

In some embodiments, the first optical adjustment layer 13 is sandwiched between the first hard coating layer 12 and the first transparent conductor layer 14. The second optical adjustment layer 23 is sandwiched between the second hard coating layer 22 and the second transparent conductor layer 24. A refractive index of the first optical adjustment layer 13 is configured to be at a mean value between the refractive index of the first hard coating layer 12 and the first transparent conductor layer 14. A material of the first optical adjustment layer 13 is selected from the group consisting of silicone polymer, acrylate polymer, aromatic ring or naphthalene ring polymer, zirconium oxide, titanium oxide, and antimony oxide. The first optical adjustment layer 13 has a thickness of about 100 nm to about 2000 nm. The thickness of the second optical adjustment layer 23 is similar to that of the first optical adjustment layer 13.

In the illustrated embodiment, the first transparent conductor layer 14 forms a plurality of smaller protrusions 31 on a surface thereof. The protrusions 31 result from the plurality of smaller first particles 16 included at a corresponding position of the first hard coating layer 12. The first transparent conductor layer 14 further forms a plurality of larger protrusions 32. The protrusions 32 result from the plurality of larger second particles 18 included in the first optical adjustment layer 13. The first transparent conductor layer 14 has about 100 to about 2000 protrusions 31 and 32 per square millimeter, respectively.

When the transparent conductive film 10 is rolled up to a roll, the first transparent conductive layer 14 and the second transparent conductive layer 24 will contact with each other through a point-to-surface manner rather than a direct surface-to-surface manner, and the density of the point-to-surface contact will also be increased, thus avoiding pressure blocking. Additionally, in the production process of the conductive film 10, particularly when the manufactured first optical adjustment layer 13 is rolled for the next process, the plurality of second particles 18 may prevent the occurrence of undesirable conditions such as pressure blocking of the optical adjustment layers 13 and 23.

The first transparent conductor layer 14 is formed on the first optical adjustment layer 13. The first transparent conductor layer 14 has a high transmittance (about 80% or higher) in a visible light region (380 nm to 780 nm). The first transparent conductor layer 14 is formed by a layer having a surface resistance value (unit: $\Omega/m^2$) per unit area of about 500Ω per square or lower. The first transparent conductor layer 14 has a thickness of about 10 nm to about 100 nm. In one embodiment, the thickness can range from about 15 nm to about 50 nm. The first transparent conductor layer 14 is typically made of any one of indium tin oxide (ITO), indium zinc-oxide or indium oxide-zinc oxide composite oxide. The second transparent conductor layer 24 is formed on a surface of the second optical adjustment layer 23 away from the substrate 11. Properties and a material for the second transparent conductor layer 24 are similar to those for the first transparent conductor layer 13.

The first transparent conductor layer 14 is patterned in a later process and then the difference of the refractive index between a portion with the first transparent conductor layer 14 and a portion without the first transparent conductor layer 14 is minimized to prevent patterns of the first transparent conductor layer 14 from being viewed by the first optical adjustment layer 13. Functions of the second optical adjustment layer 23 are similar to the above.

By adding the plurality of first particles 16 into the first hard coating layer 12 and the second hard coating layer 22, and adding the plurality of second particles 18 into the first optical adjustment layer 13 and the second optical adjustment layer 23, the aforementioned transparent conductive film 10 can not only prevent pressure blocking when the conductive film is rolled up, but also reduce the haze value and the roughness of the transparent conductive film 10, decrease the light reflection due to the large particles, and improve its light transmittance, thereby improve the appearance of the product and the user experience.

Figure 2:
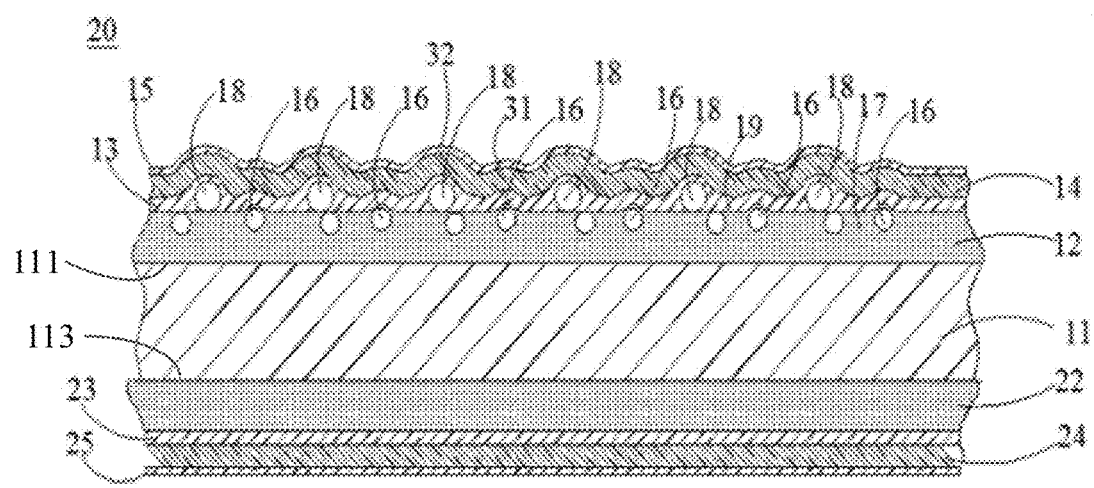
FIG. 2 is a cross-sectional view of a transparent conductive film according to a second embodiment.

Referring to FIG. 2, a transparent conductive film 20 according to a second embodiment is substantially the same as the transparent conductive film 10 in the first embodiment. The difference is that, the transparent conductive film 20 further includes a first metal layer 15 formed on a surface of the first transparent conductor layer 14 away from the first optical adjustment layer 13, and a second metal layer 25 formed on a surface of the second transparent conductor layer 24 away from the second optical adjustment layer 23. In alternative embodiments, the transparent conductive film 20 may include a first metal layer 15 formed on a surface of the first transparent conductor layer 14 away from the first optical adjustment layer 13 or a second metal layer 25 formed on a surface of the second transparent conductor layer 24 away from the second optical adjustment layer 23. This simplifies the process and saves cost.

The first metal layer 15 is used to form wirings outside a touch input region when using the transparent conductive film of the embodiment for a touch panel. A material of the first metal layer 15 and/or the second metal layer 25 is typically copper, silver, nickel, or alloy thereof, and any other metal excellent in conductivity is also used. In one embodiment, the first metal layer 15 has a thickness of about 50 nm to about 500 nm. In another embodiment, the thickness can range from about 100 nm to about 300 nm. The uses and the thickness of the second metal layer 25 is similar to those of the first metal layer 15. Such arrangements minimizes the overall thickness of the conductive film, providing conditions for subsequent provision of ultra-thin electronic products or mobile terminals.

The surface of the first metal layer 15 is similar to that of the first transparent conductor layer 14 and has a plurality of protrusions 31 and 32 in a random or regular manner. The first metal layer 15 has about 100 to about 5,000 protrusions 31 and 32 per square millimeter, respectively. In one embodiment, the first metal layer 15 has about 100 to about 1,000 protrusions 31 and 32 per square millimeter. The surface of the first metal layer 15 has an arithmetic mean roughness Ra of about 0.005 μm to about 0.05 μm. In one embodiment, the arithmetic mean roughness Ra can range from about 0.005 μm to about 0.03 μm. The surface of the first metal layer 15 has a maximum height Rz of about 0.5 μm to about 3.0 μm. In one embodiment, the maximum height Rz can range from about 0.5 μm to about 2.0 μm. It is possible to change the arithmetic mean roughness Rz and the maximum height Rz of the surface of the first metal layer 15 by adjusting the shape, the size, and the content of respective particles 16 and 18. The surface shape of the second transparent conductor layer 24 is reflected in the surface of the second metal layer 25. In some embodiments, the surface of the second metal layer 25 has a plurality of protrusions 33 and 34 distributed in a random or regular manner. The surface roughness of the second metal layer 25 is similar to that of the first metal layer 15.

When the transparent conductive film 20 is rolled up, the surface of the first metal layer 15 will contact with the surface of the second metal layer 25. There are a plurality of protrusions 31 and 32 randomly or evenly distributed on the surface. Accordingly, the first metal layer 15 may contact with the surface of the second metal layer 25 through a point-to-surface manner. This makes it possible to prevent the first metal layer 15 and the second metal layer 25 to be bonded by pressing.

The first metal layer 15 and the second metal layer 25 are provided in the transparent conductive film 20 to facilitate the use of the transparent conductive film 20 for a touch panel to forming an electrode wiring in the non-display region of the touch panel. It is thus possible to avoid the problem that the sensitivity of the signal transmission is reduced and the power consumption is increased caused by using a material having a larger impedance same as the transparent conductor layers (14 or 24) (commonly known as indium tin oxide (ITO)) to produce a frame electrode wiring.

Figure 3:
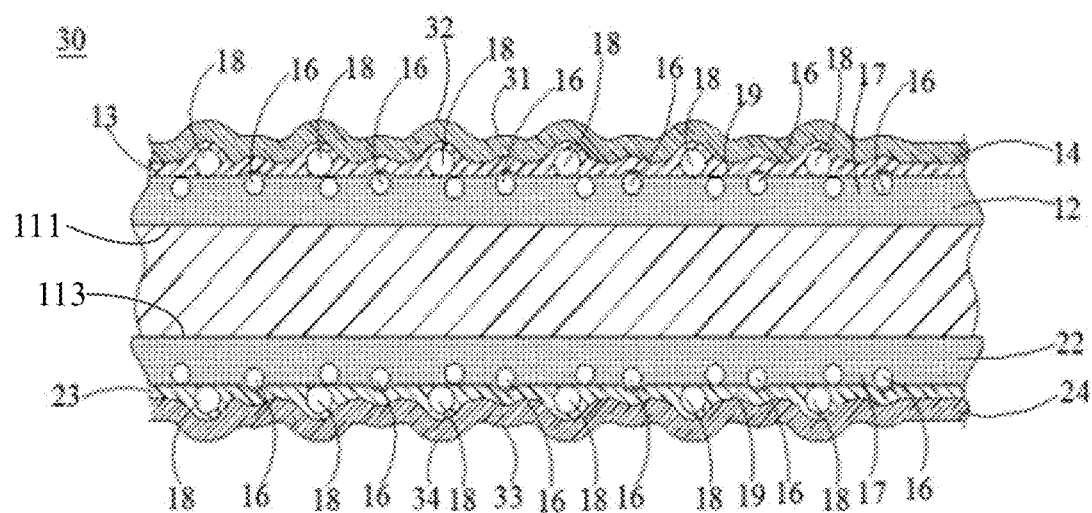
FIG. 3 is a cross-sectional view of a transparent conductive film according to a third embodiment.

Referring to FIG. 3, a transparent conductive film 30 according to a third embodiment is substantially the same as the transparent conductive film 10 in the first embodiment. The difference is that, the second hard coating layer 22 includes the first binder resin 17 and the plurality of first particles 16 distributed in the first binder resin 17, the second optical adjustment layer 23 includes the second binder resin 19 and the plurality of second particles 18 distributed in the second binder resin 19. The plurality of first particles 16 and the plurality of second particles 18 may be randomly distributed in the first binder resin 17 near a surface thereof and the second binder resin 19, respectively. It should be understood that, in alternative embodiments, the plurality of first particles 16 and the plurality of second particles 18 may also be evenly distributed in the first binder resin 17 near a surface thereof and the second binder resin 19, respectively.

In the illustrated embodiment, the second transparent conductor layer 24 forms a plurality of smaller protrusions 33 on a surface thereof. The protrusions 33 result from the plurality of smaller first particles 16 included at a corresponding position of the second hard coating layer 22. The second transparent conductor layer 24 further forms a plurality of larger protrusions 34. The protrusions 34 result from the plurality of larger second particles 18 included in the second optical adjustment layer 23. The second transparent conductor layer 24 has about 100 to about 5000 protrusions 33 and 34 per square millimeter, respectively.

With respect to the transparent conductive film 10, the transparent conductive film 30 forms a plurality of protrusions 31, 32, 33 and 34 on the opposed surfaces thereof, such that when the transparent conductive film 30 is rolled up to a roll, the first transparent conductive layer 14 will contact with the second transparent conductive layer 24 by protrusions 32 and protrusions 34, i.e., through a point-to-point manner rather than a point-to-surface manner in the first embodiment, thus the prevention effects for pressure bonding is better. Additionally, in the production process of the conductive film 30, particularly when the manufactured second optical adjustment layer 23 is rolled for the next process, the plurality of second particles 18 may prevent the occurrence of undesirable conditions such as pressure bonding of the optical adjustment layers 13 and 23.

In some embodiments, the content of the first particles 16 is about 0.01 wt % to about 10 wt % of the first hard coating layer 12. The content of the first particles 16 is about 0.01 wt % to about 10 wt % of the second hard coating layer 22. The higher the weight content of the first particles 16, the higher the haze value of the transparent conductive film 30, the lower the light transmittance, whereas the better the prevention effects for pressure bonding. It has been experimentally demonstrated that when the content of the first particles 16 is about 0.01 wt % to about 10 wt % of the first hard coating layer 12, the content of the first particles 16 is about 0.01 wt % to about 10 wt % of the second hard coating layer 22, the transparent conductive film 30 has an optimal pressure bonding resistance and a favorable light transmittance.

In alternative embodiments, the content of the second particles 18 is about 0.01 wt % to about 4.5 wt % of the first optical adjustment layer 13. The content of the second particles 18 is about 0.01 wt % to about 4.5 wt % of the second optical adjustment layer 23. The higher the weight content of the plurality of second particles 18, the higher the haze value of the transparent conductive film 30, the lower the light transmittance, whereas the better the prevention effects for pressure bonding. It has been experimentally demonstrated that when the content of the second particles 18 is about 0.01 wt % to about 4.5 wt % of the first optical adjustment layer 13, the content of the second particles 18 is about 0.01 wt % to about 4.5 wt % of the second optical adjustment layer 23, the transparent conductive film 30 has an optimal pressure bonding resistance and a favorable light transmittance.

Figure 4:
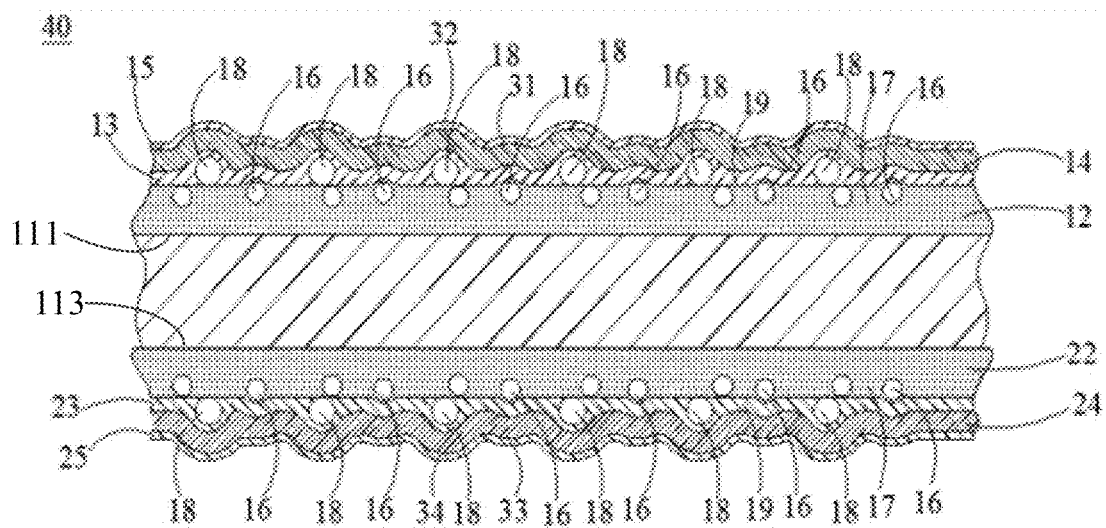
FIG. 4 is a cross-sectional view of a transparent conductive film according to a fourth embodiment.

Referring to FIG. 4, a transparent conductive film 40 according to a fourth embodiment is substantially the same as the transparent conductive film 30 in the third embodiment. The difference is that, the transparent conductive film 40 further includes a first metal layer 15 formed on a surface of the first transparent conductor layer 14 away from the first optical adjustment layer 13, and a second metal layer 25 formed on a surface of the second transparent conductor layer 24 away from the second optical adjustment layer 23. In alternative embodiments, the transparent conductive film 40 may include a first metal layer 15 formed on a surface of the first transparent conductor layer 14 away from the first optical adjustment layer 13 or a second metal layer 25 formed on a surface of the second transparent conductor layer 24 away from the second optical adjustment layer 23. This simplifies the process and saves cost.

The first metal layer 15 and the second metal layer 25 are provided in the transparent conductive film 40 to facilitate the use of the transparent conductive film 40 for a touch panel to forming an electrode wiring in the non-display region of the touch panel. It is thus possible to avoid the problem that the sensitivity of the signal transmission is reduced and the power consumption is increased caused by using a material having a larger impedance same as the transparent conductor layers (14 or 24) (commonly known as indium tin oxide (ITO)) to produce a frame electrode wiring.

Figure 5:
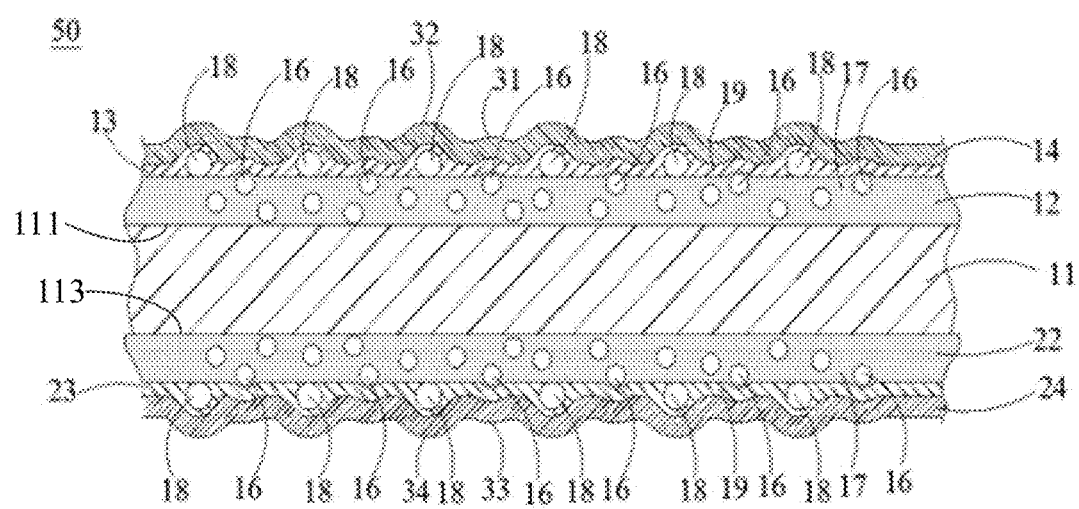
FIG. 5 is a cross-sectional view of a transparent conductive film according to a fifth embodiment.

Referring to FIG. 5, a transparent conductive film 50 according to a fifth embodiment is substantially the same as the transparent conductive film 30 in the third embodiment. The difference is that, the plurality of first particles 16 in the transparent conductive film 50 are distributed in the first binder resin 17 near a surface thereof and in the interior thereof rather than only near the surface thereof, the plurality of first particles 16 are also distributed in the first binder resin 17 near a surface thereof and in the interior thereof rather than only near the surface thereof.

Compared to the transparent conductive film 30, the distribution of the first particles 16 in the interior of the first binder resin 17 may appropriately control the adjustment of the haze value of the transparent conductive film 50 within an appropriate range, such as about 0.5 to about 3. This may make the user difficult to detect the fine damage of the substrate 11 while ensuring better visibility of the conductive film.

Figure 6:
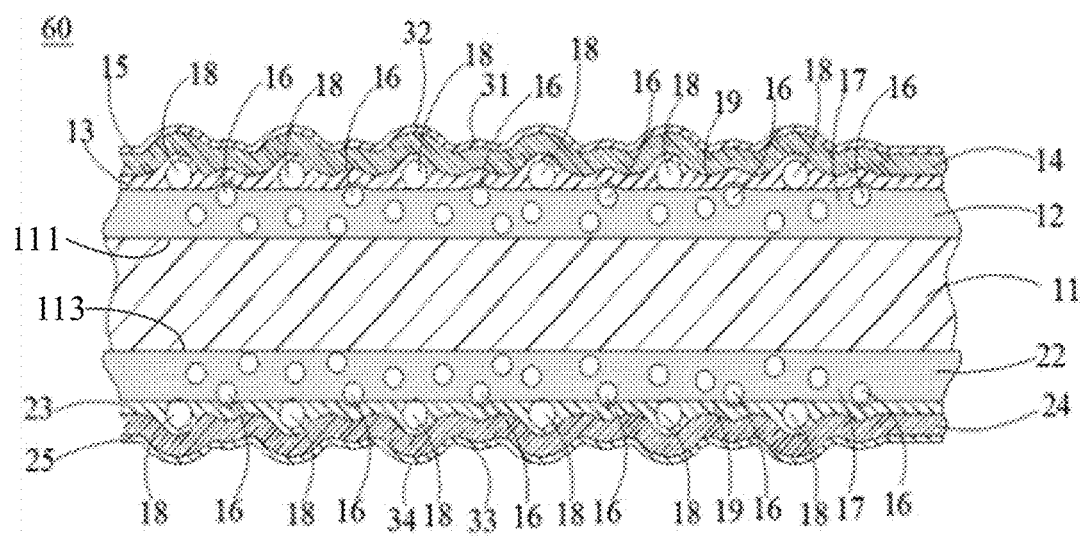
FIG. 6 is a cross-sectional view of a transparent conductive film according to a sixth embodiment.

Referring to FIG. 6, a transparent conductive film 60 according to a sixth embodiment is substantially the same as the transparent conductive film 50 in the fifth embodiment. The difference is that, the transparent conductive film 60 further includes a first metal layer 15 formed on a surface of the first transparent conductor layer 14 away from the first optical adjustment layer 13, and a second metal layer 25 formed on a surface of the second transparent conductor layer 24 away from the second optical adjustment layer 23. In alternative embodiments, the transparent conductive film 60 may include a first metal layer 15 formed on a surface of the first transparent conductor layer 14 away from the first optical adjustment layer 13 or a second metal layer 25 formed on a surface of the second transparent conductor layer 24 away from the second optical adjustment layer 23. This simplifies the process and saves cost.

The first metal layer 15 and the second metal layer 25 are provided in the transparent conductive film 60 to facilitate the use of the transparent conductive film 60 for a touch panel to forming an electrode wiring in the non-display region of the touch panel. It is thus possible to avoid the problem that the sensitivity of the signal transmission is reduced and the power consumption is increased caused by using a material having a larger impedance same as the transparent conductor layers (14 or 24) (commonly known as indium tin oxide (ITO)) to produce a frame electrode wiring.

When the transparent conductive films 40, 60 are rolled up, the surface of the first metal layer 15 will contact with the surface of the second metal layer 25. There are a plurality of protrusions 31 and 32 randomly or evenly distributed on the surface of the first metal layer 15. And there are a plurality of protrusions 33 and 34 randomly or evenly distributed on the surface of the second metal layer 25. Accordingly, the first metal layer 15 will contact with the second metal layer 25 through a point-to-point manner. This enables to prevent blocking of the first metal layer 15 and the second metal layer 25. Performance for preventing blocking of the first metal layer 15 and the second metal layer 25 are better than those in the foregoing embodiments.

Figure 7:
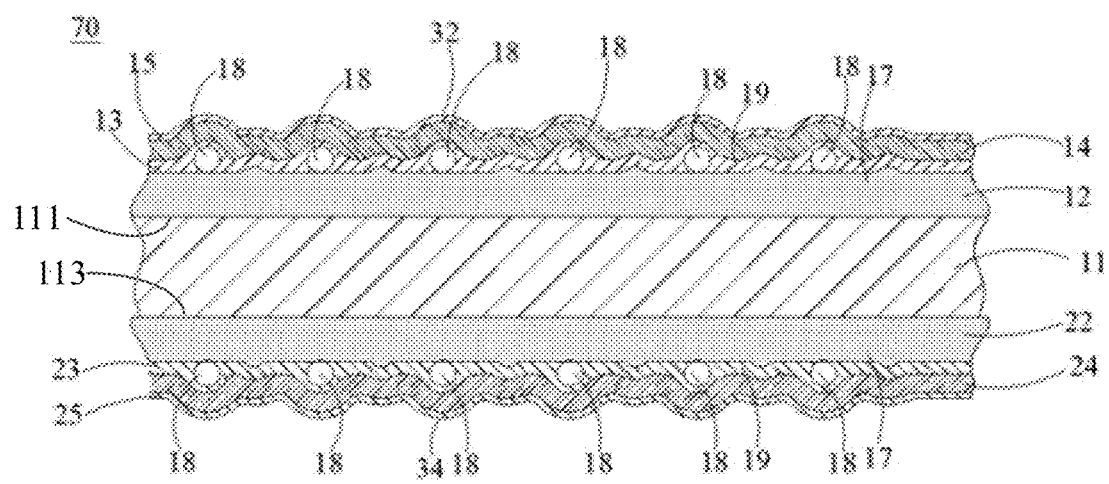
FIG. 7 is a cross-sectional view of a transparent conductive film according to a seventh embodiment.

Referring to FIG. 7, a transparent conductive film 70 according to a seventh embodiment is substantially the same as the transparent conductive film 60 in the sixth embodiment. The difference is that, the transparent conductive film 70 only includes a plurality of particles 18 in the first optical adjustment layer 13 and the second optical adjustment layer 23, thus the first metal layer 15 has a plurality of protrusions 32 on a surface thereof and the second metal layer 25 has a plurality of protrusions 34 on a surface thereof. The plurality of protrusions 32 and 34 are resulted from the plurality of particles 18 included in the first optical adjustment layer 13 and the second optical adjustment layer 23

With respect to the transparent conductive film 60, the transparent conductive film 70 can reduce a process of adding particles to the first hard coating layer 12 and the second hard coating layer 22, thereby improving the yield and saving the cost. Furthermore, while ensuring that the damage resistance of the hard coating layers 12 and 22 is not reduced, a plurality of particles 18 may ensure that when the transparent conductive film 10 is rolled up to a roll, the first transparent conductive layer 14 will contact with the second transparent conductive layer 24 by protrusions 32 and protrusions 34, i.e., through a point-to-point manner rather than a point-to-surface manner in the first embodiment, thus the prevention effects for pressure blocking is better.

One example of a method for manufacturing a transparent conductive film 60 will now be described below. First, a hard coating agent is applied to one surface of a substrate 11. The hard coating agent includes a first binder resin 17 and a plurality of first particles 16 distributed in the first binder resin 17. Next, the hard coating agent is applied to the other surface of the substrate 11. And then the hard coating agent is cured by the irradiation of ultraviolet rays with the hard coating agent applied to both surfaces of the substrate 11 to form a first hard coating layer 12 and a second hard coating layer 22. Next, an optical adjustment agent is applied to a surface of the first hard coating layer 12 and an optical adjustment agent is applied to a surface of the second hard coating layer 22. The optical adjustment agent includes a second binder resin 19 and a plurality of second particles 18 distributed in the second binder resin 19. Subsequently, ultraviolet rays are irradiated with the optical adjustment agent applied onto the first hard coating layer 12 and the optical adjustment agent applied onto the second hard coating layer 22 to cause the optical adjustment agent to be cured to form a first optical adjustment layer 13 and a second optical adjustment layer 23. Subsequently, a first transparent conductor layer 13 and a first metal layer 15 are sequentially laminated on a surface of the first optical adjustment layer 13 by a sputtering method or the like. It is possible to sequentially laminate the first transparent conductor layer 14 and the first metal layer 15 by providing a target for a transparent conductor layer and a target for a metal layer in a sputtering apparatus. Similarly, the second transparent conductor layer 24 and the second metal layer 25 are sequentially laminated on a surface of the second optical adjustment layer 23.

Figure 8:
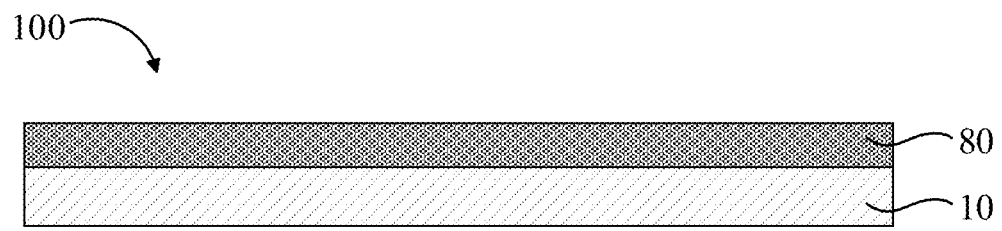
FIG. 8 is a cross-sectional view of a capacitance-type touch panel according to an embodiment.

Referring to FIG. 8, a capacitance-type touch panel 100 according to an embodiment includes the aforementioned transparent conductive film 10 (having been patterned further). In the illustrated embodiment, the capacitance-type touch panel 100 further includes a cover lens 80 disposed on a surface of the transparent conductive film 10.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A transparent conductive film, comprising:
   a substrate having opposed first and second surfaces;
   a first hard coating layer formed on the first surface, the first hard coating layer comprising a first binder resin and a plurality of first particles distributed in the first binder resin;
   a first optical adjustment layer formed on the first hard coating layer, the first optical adjustment layer comprising a second binder resin and a plurality of second particles distributed in the second binder resin, wherein a size of the plurality of second particles are larger than a size of the plurality of first particles;
   a first transparent conductor layer formed on the first optical adjustment layer, the first transparent conductor layer having a plurality of larger protrusions on a surface thereof corresponding to the plurality of second particles and a plurality of smaller protrusions corresponding to the plurality of first particles;
   a second hard coating layer formed on the second surface;
   a second optical adjustment layer formed on the second hard coating layer; and
   a second transparent conductor layer formed on the second optical adjustment layer.

2. The transparent conductive film of claim 1, wherein the second hard coating layer comprises the first binder resin and the plurality of first particles distributed in the first binder resin, the second optical adjustment layer comprises the second binder resin and the plurality of second particles distributed in the second binder resin.

3. The transparent conductive film of claim 1, wherein the first particles and/or the second particles are substantially sphere-shaped.

4. The transparent conductive film of claim 3, wherein the first particle has a diameter of about 5% to about 25% of a thickness of the first hard coating layer.

5. The transparent conductive film of claim 3, wherein the second particle has a diameter of about 0.1 µm to about 2 µm.

6. The transparent conductive film of claim 1, wherein the first hard coating layer and the second hard coating layer have a thickness of about 1 μm to about 3 μm.

7. The transparent conductive film of claim 3, wherein the second particle has a diameter greater than a thickness of the second binder resin.

8. The transparent conductive film of claim 1, wherein the content of the first particles is about 0.01 wt % to about 10 wt % of the first hard coating layer.

9. The transparent conductive film of claim 2, wherein the content of the first particles is about 0.01 wt % to about 10 wt % of the second hard coating layer.

10. The transparent conductive film of claim 1, wherein the content of the second particles is about 0.01 wt % to about 4.5 wt % of the first optical adjustment layer.

11. The transparent conductive film of claim 2, wherein the content of the second particles is about 0.01 wt % to about 4.5 wt % of the second optical adjustment layer.

12. The transparent conductive film of claim 1, further comprising a first metal layer formed on a surface of the first transparent conductor layer away from the first optical adjustment layer and a second metal layer formed on a surface of the second transparent conductor layer away from the second optical adjustment layer.

13. The transparent conductive film of claim 1, further comprising a first metal layer formed on a surface of the first transparent conductor layer away from the first optical adjustment layer or a second metal layer formed on a surface of the second transparent conductor layer away from the second optical adjustment layer.

14. The transparent conductive film of claim 1, wherein the first metal layer and/or the second metal layer has a thickness of about 50 nm to about 500 nm.

15. The transparent conductive film of claim 1, wherein the first particles and the second particles are made of a material selected from the group consisting of silica, silicone polymer, acrylic polymer, and styrene polymer.

16. A transparent conductive film, comprising:
a substrate having opposed first and second surfaces;
a first hard coating layer formed on the first surface, the first hard coating layer comprising a first binder resin and a plurality of first particles distributed in the first binder resin;
a first optical adjustment layer formed on the first hard coating layer, the first optical adjustment layer comprising a second binder resin and a plurality of second particles distributed in the second binder resin, wherein a size of the plurality of second particles is larger than a size of the plurality of first particles;
a first transparent conductor layer formed on the first optical adjustment layer, the first transparent conductor layer having a plurality of larger protrusions on a surface thereof corresponding to the plurality of second particles and a plurality of smaller protrusions corresponding to the plurality of first particles;
a first metal layer formed on the first transparent conductor layer;
a second hard coating layer formed on the second surface, the second hard coating layer comprising the first binder resin and the plurality of first particles distributed in the second binder resin;
a second optical adjustment layer formed on the second hard coating layer, the second optical adjustment layer comprising the second binder resin and the second plurality of particles distributed in the binder resin;
a second transparent conductor layer formed on the second optical adjustment layer, the second transparent conductor layer having a plurality of larger protrusions on a surface thereof corresponding to the second plurality of particles and a plurality of smaller protrusions corresponding to the plurality of first particles; and
a second metal layer formed on the second transparent conductor layer.

17. The transparent conductive film of claim 16, wherein the particle is substantially sphere-shaped and has a diameter of about 0.1 μm to about 3 μm.

18. The transparent conductive film of claim 16, wherein the first optical adjustment layer and the second optical adjustment layer have a thickness of about 0.1 μm to about 2 μm.

19. A capacitance-type touch panel, comprising a transparent conductive film, wherein the transparent conductive film comprises:
a substrate having opposed first and second surfaces;
a first hard coating layer formed on the first surface, the first hard coating layer comprising a first binder resin and a plurality of first particles distributed in the first binder resin;
a first optical adjustment layer formed on the first hard coating layer, the first optical adjustment layer comprising a second binder resin and a plurality of second particles distributed in the second binder resin, wherein a size of the plurality of second particles are larger than a size of the plurality of first particles;
a first transparent conductor layer formed on the first optical adjustment layer, the first transparent conductor layer having a plurality of larger protrusions on a surface thereof corresponding to the plurality of second particles and a plurality of smaller protrusions corresponding to the plurality of first particles;
a second hard coating layer formed on the second surface;
a second optical adjustment layer formed on the second hard coating layer; and
a second transparent conductor layer formed on the second optical adjustment layer.

* * * * *